(12) United States Patent
Yu et al.

(10) Patent No.: US 6,764,952 B1
(45) Date of Patent: Jul. 20, 2004

(54) SYSTEMS AND METHODS TO RETARD COPPER DIFFUSION AND IMPROVE FILM ADHESION FOR A DIELECTRIC BARRIER ON COPPER

(75) Inventors: Jengyi Yu, San Jose, CA (US); Ka Shun Wong, San Jose, CA (US); Sanjeev Jain, Santa Clara, CA (US); Somnath Nag, Saratoga, CA (US); Haiying Fu, West Linn, OR (US); Atul Gupta, Mountain View, CA (US); Bart J. Van Schravendijk, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/099,232

(22) Filed: Mar. 13, 2002

(51) Int. Cl.[7] .............................................. H01L 21/44
(52) U.S. Cl. ........................ 438/687; 438/778; 438/791; 438/958
(58) Field of Search ................................. 438/687, 778, 438/791, 958

(56) References Cited

U.S. PATENT DOCUMENTS 6,432,822 B1 * 8/2002 Ngo et al. ................... 438/687
2002/0119651 A1 * 8/2002 Noguchi et al. ............ 438/687

* cited by examiner

Primary Examiner—Lynne Gurley
(74) Attorney, Agent, or Firm—Beyer, Weaver & Thomas, LLP.

(57) ABSTRACT

Two sequential treatments within a chemical vapor deposition chamber, or within sequential chambers without a vacuum break, are performed on a copper layer to clean and passivate the copper surface prior to deposition of a copper diffusion barrier layer or a dielectric layer. The first treatment includes an ammonia, a hydrogen, or a hydrocarbon plasma cleaning of the copper surface followed by a short initiation of an organosilane precursor or a thin silicon nitride layer. A copper diffusion barrier layer may then be formed over the pretreated copper surface using an organosilane plasma, with or without a carbon dioxide or a carbon monoxide, or a silane with a nitrogen gas and an ammonia gas. Copper diffusion is retarded and film adhesion is improved for a dielectric layer or a copper diffusion barrier layer on the copper surface.

25 Claims, 4 Drawing Sheets

SYSTEMS AND METHODS TO RETARD COPPER DIFFUSION AND IMPROVE FILM ADHESION FOR A DIELECTRIC BARRIER ON COPPER

BACKGROUND OF THE INVENTION

1. Field of the Invention

The present invention relates generally to semiconductor processing and, more particularly, to processing of a copper layer and subsequent layers.

2. Related Art

Integrated circuits fabricated on semiconductor substrates often require multiple levels of metal layers to provide the necessary electrical interconnections. The metal layers are separated by various insulating or dielectric layers, which are also known as inter-level dielectric (ILD) layers or inter-metal dielectric (IMD) layers. For example, in the damascene approach, a metal layer (i.e., a metal conductor pattern) is embedded in the dielectric layer or film to provide a planar interconnection layer.

Copper (Cu) can be used as the material for the metal layer. One drawback of copper is that copper atoms can migrate or diffuse into the adjacent dielectric layer, which reduces the insulator's integrity. For example, copper diffusion in silicon oxide (Si—O) based dielectrics is a known problem for interconnects formed with the damascene approach.

To prevent copper diffusion, a copper diffusion barrier layer (also known as a dielectric diffusion barrier (DDB) layer) can be formed between the metal layer and the subsequently deposited dielectric layer. For example, 500 Å to 1000 Å of silicon nitride ($Si_3N_4$) or silicon carbide (SiC) can be used as a copper diffusion barrier layer. However, one drawback is that the total effective dielectric constant (k) of a damascene interconnect (i.e., an interconnect scheme formed by the damascene approach) increases due to the addition of the copper diffusion barrier layer. As is known, low-k dielectric insulators are desired to minimize resistive-capacitance (RC) interconnect delays and power consumption.

Another drawback is that the film adhesion of the copper diffusion barrier layer or dielectric layer on the copper surface is poor when copper oxide or contaminants exist. If the dielectric barrier is permeable to oxygen, copper oxide may be formed even after the planarized copper layer is capped with the dielectric layer. In addition, the presence of copper oxide on the interface of the copper layer and the dielectric barrier layer deteriorates the electron-migration performance of the copper interconnects.

Various techniques can be used to clean the copper surface to improve the film adhesion, but the copper surface may be re-oxidized, for example, if the copper diffusion barrier layer or dielectric layer contains any oxygen. Accordingly, methods are needed to improve film adhesion and reduce copper diffusion.

BRIEF SUMMARY OF THE INVENTION

Systems and methods are disclosed herein, for example, to retard copper diffusion and improve film adhesion for a copper diffusion barrier layer or a dielectric etch stop layer on a copper metal layer. Two treatments within a chemical vapor deposition chamber or within sequential chambers are performed on a copper layer to clean and passivate the copper surface prior to deposition of a copper diffusion barrier layer or a dielectric etch stop layer.

The first treatment includes an in-situ plasma cleaning of the copper surface followed by the formation of an ultra-thin passivation and glue layer. The plasma cleaning contains reactive hydrogen species generated from at least one of ammonia, hydrogen, and hydrocarbon ($C_xH_y$ where x=0,1,2, etc. and y=2,4,6, etc.) or their combinations. The ultra-thin passivation and glue layer is formed by performing a short initiation of an organosilane precursor or by depositing a thin silicon nitride layer. A copper diffusion barrier layer or a dielectric etch stop layer can then be formed over the cleaned and passivated copper surface using a silane or organosilane plasma with or without a carbon dioxide, a carbon monoxide, an ammonia, or a nitrogen gas feed.

For example, typical process parameters for the first treatment in a plasma enhanced chemical vapor deposition chamber include, but are not limited to, a flow rate of 2000 to 6000 sccm for ammonia, hydrogen, or hydrocarbon, a radio frequency power density of 100 to 500 W per deposition station, and a pressure of 1 to 5 Torr for a duration of 3 to 120 seconds The typical process parameters for the second treatment in the chamber include, but are not limited to, a flow rate of 200 to 1500 sccm for tetramethylsilane (4MS) or 200 to 1000 sccm for silane ($SiH_4$) and 2000 to 5000 sccm for nitrogen and ammonia, a radio frequency power density of 100 to 300 W, and a pressure of 1 to 5 Torr for a 1 to 5 second duration.

In accordance with one embodiment of the present invention, a method of treating a copper layer of a semiconductor device includes performing a plasma treatment on the copper layer in a chemical vapor deposition chamber followed by performing an organosilane plasma treatment or thin silicon nitride deposition in the same or sequential chemical vapor deposition chamber to passivate and glue the copper layer. The method may further include depositing a copper diffusion barrier layer after the organosilane plasma treatment has been performed.

In accordance with another embodiment of the present invention, a method of semiconductor processing includes introducing an ammonia gas, a hydrogen gas, a hydrocarbon gas, or one or more of their combinations, into a chemical vapor deposition chamber to remove surface oxide and contaminants on a copper layer of a semiconductor device and introducing an organosilane gas or silane and nitrogen gases into the same or sequential chemical vapor deposition chamber to prevent oxidation of the copper layer after the copper layer is cleaned. The method may further include introducing an organosilane or silane gas, with or without a carbon dioxide, a carbon monoxide, an ammonia, and/or a nitrogen gas, into the same or sequential chemical vapor deposition chamber to deposit a copper diffusion barrier layer or etch stop layer.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION OF THE INVENTION

Figure 1:
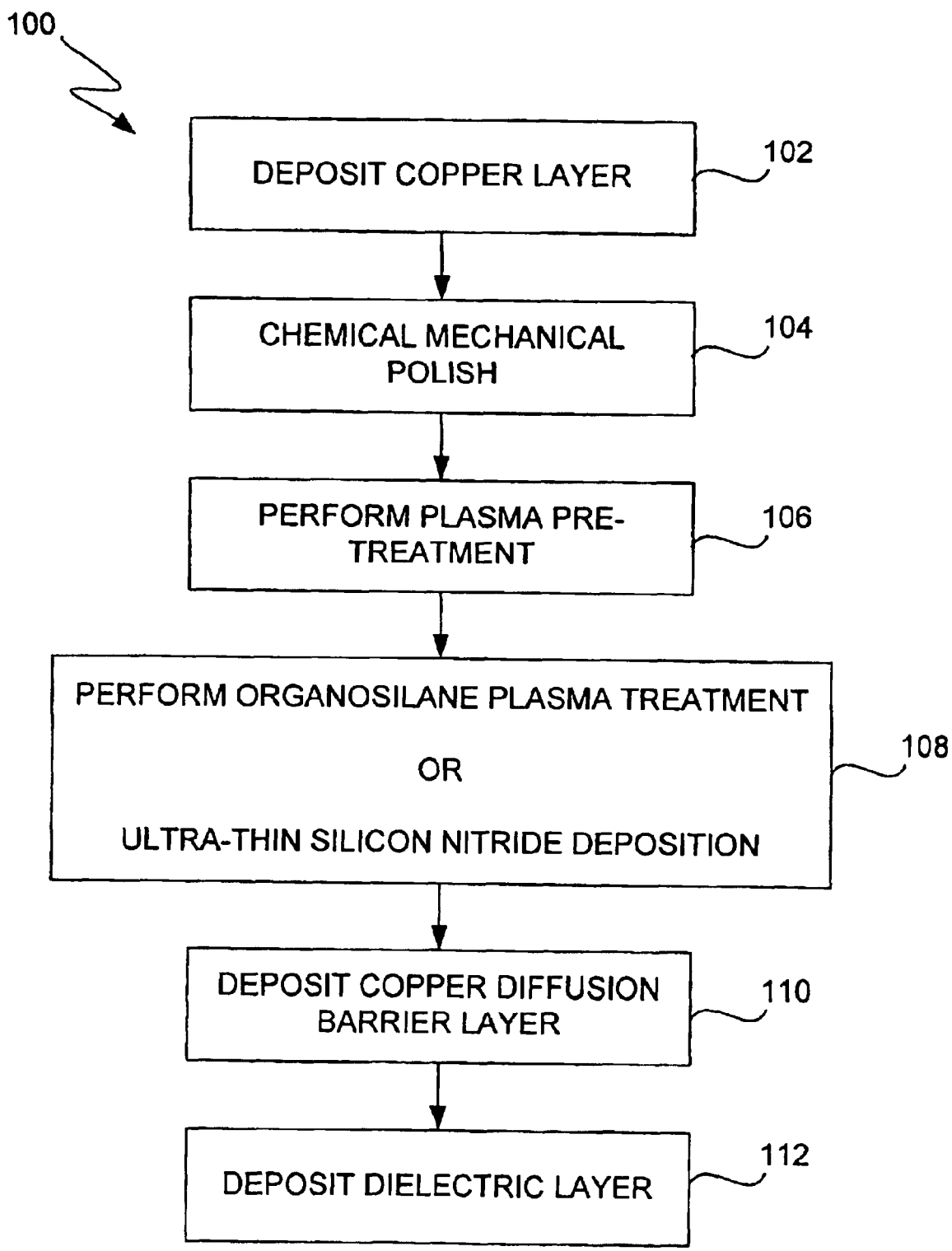
FIG. 1 is a flowchart illustrating semiconductor processing steps in accordance with one or more embodiments of the present invention.

FIG. 1 is a flowchart 100 illustrating semiconductor processing steps in accordance with one or more embodiments of the present invention. The semiconductor processing steps are performed in a chemical vapor deposition (CVD) chamber, such as a plasma enhanced chemical vapor deposition (PECVD) chamber or a high density plasma (HDP) CVD chamber. The semiconductor processing steps may also be performed sequentially in one or more of these types of CVD chambers. For example, one or more of the processing steps may be performed in one CVD chamber or some of the processing steps may be performed in one CVD chamber and some of the processing steps may be performed in another CVD chamber. The two CVD chambers may be of the same type or of different types. If more than one CVD chamber is used, a vacuum should be maintained during transfer of the substrate from one CVD chamber to the next CVD chamber.

In step 102 of flowchart 100, copper is deposited on a semiconductor device or substrate to form a copper metal layer. For example, the copper is deposited on a dielectric layer and metallic diffusion barrier layer, such as tantalum nitride (TaN) or titanium nitride (TiN) using a process known as electrofill in the electrochemical bath. The copper can be deposited to a patterned substrate to form vias and/or interconnect lines, such as in the damascene approach.

After deposition of the copper, excess copper can be removed by various known techniques, such as with a copper chemical mechanical polish (CMP) process (step 104). In step 106, a plasma process containing reactive hydrogen species is performed in the CVD chamber to clean the copper surface. Step 106 effectively removes any surface copper oxide (CuOx) or contaminants that exist on the copper surface. Step 106 may be referred to as a plasma treatment or plasma pre-treatment for the copper surface.

As noted above for the plasma pre-treatment, ammonia, hydrogen, hydrocarbon ($C_xH_y$ where x=0,1,2, etc. and y=2, 4,6, etc.) or combinations of these gases can be used to clean the copper surface. For example, typical process parameters for step 106 in a PECVD chamber include: a flow rate of 2000–6000 sccm for an ammonia, a hydrogen, or a hydrocarbon, a radio frequency (RF) power density of 100–500 W per shower head, and a pressure of 1–5 Torr for a 3–120 second duration.

EXAMPLE

A Novellus Systems Sequel™ PECVD reactor was used for the plasma pre-treatment on a copper surface of a semiconductor device. Ammonia, hydrogen, or hydrocarbon flow and radio frequency (RF) power was provided as listed below in Table 1.

TABLE 1

| PECVD Chamber Process Parameters | | | |
|---|---|---|---|
| | Example A | Example B | Example C |
| Ammoma (NH$_3$) Flow Rate (sccm) | 4000 | 0 | 0 |
| Hydrogen (H$_2$) Flow Rate (sccm) | 0 | 4000 | 0 |
| CH$_4$ Flow Rate (sccm) | 0 | 0 | 5000 |
| RF Power Density (W/showerhead) | 300 | 100 | 200 |
| Pressure (Torr) | 2.3 | 2.3 | 1.8 |
| Treatment Duration (seconds) | 6 | 6 | 6 |

Figure 2:
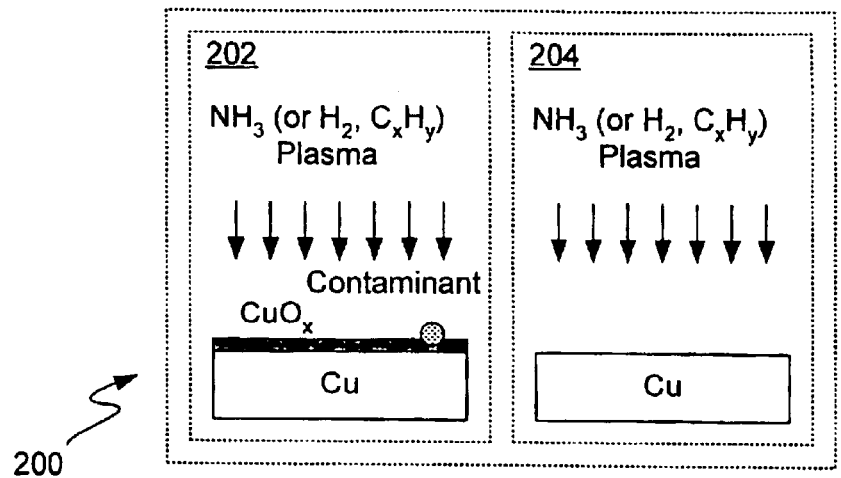
FIG. 2 is a drawing illustrating a plasma pre-treatment in accordance with an embodiment of the present invention.

Referring briefly to FIG. 2, drawing 200 illustrates the plasma treatment in step 106 of FIG. 1, with an ammonia, a hydrogen, or a hydrocarbon plasma process being performed. Sketch 202 shows the copper (Cu), with the copper oxide (CuO$_x$) and contaminants on the copper surface, receiving the ammonia and/or nitrogen plasma treatment (indicated by arrows drawn in sketch 202). Sketch 204 shows the copper surface cleansed of the copper oxide and contaminants as the plasma treatment nears completion.

Returning to FIG. 1, in step 108 an organosilane plasma process or thin silicon nitride process is performed in the same or sequential CVD chamber to passivate the copper surface that was cleaned during step 106. The organosilane precursor for example includes, but is not limited to, trimethylsilane (3MS or (CH$_3$)$_3$SiH), tetramethylsilane (4MS or (CH$_3$)$_4$Si), trimethylsilyl acetylene (TMSA or C$_5$H$_{10}$Si), trimethylvinylsilane (TMVS or C$_5$H$_{12}$Si), trimethylsilyl propyne (TMSP or C$_5$H$_{12}$Si), or phenyl trimethylsilane (PTMS or C$_9$H$_{14}$Si). Step 108 may comprise only a short initiation of an organosilane precursor, with or without nitrogen and ammonia, into the CVD chamber immediately after step 106 or silicon nitride (e.g., creating an approximately 30 to 200 Å silicon nitride layer).

The organosilane precursor or thin silicon nitride layer passivates the clean copper surface with a few monolayers of dielectric material to prevent oxidation on the copper surface. The interfacial dielectric material resulting from the organosilane plasma will include silicon, carbon, and hydrogen. No evidence of copper silicide formation can be found with X-ray photoelectron spectra of the resulting layer. Step 108 may be referred to as an organosilane plasma treatment (if utilizing an organosilane precursor) for the copper surface.

As noted above, organosilane precursors such as, for example, 3MS, 4MS, TMSA, TMVS, TMSP, or PTMS can be used to passivate the freshly cleaned copper surface. For example, a preferred precursor may include tetramethylsilane (4MS), with typical process parameters for step 108 in a PECVD chamber being a flow rate of 200–1500 sccm for 4MS, a radio frequency power density at 100–300 W and a pressure at 1–5 Torr for a 1–5 second duration. Using these parameters, a passivation layer of approximately 10 to 200 Å may be formed.

EXAMPLE

Figure 3:
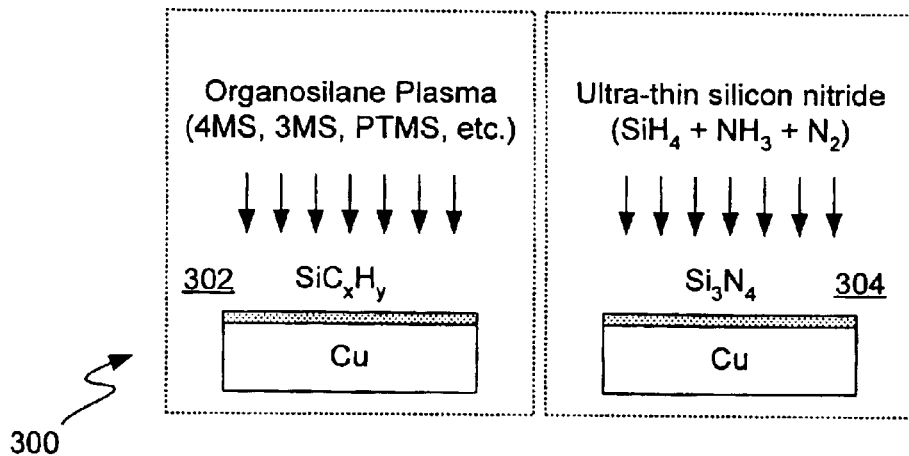
FIG. 3 is a drawing illustrating an organosilane plasma treatment in accordance with an embodiment of the present invention.

A Novellus Systems Sequel™ PECVD reactor was used for an organosilane plasma treatment, with of without nitrogen and ammonia gases, and a silicon nitride treatment on a freshly cleaned copper surface of a semiconductor device (Example A and B, respectively, in FIG. 3.) The 4MS and silane flows, along with other parameters such as radio frequency (RF) power, were provided as listed below in Table 2.

TABLE 2

PECVD Chamber Process Parameters

|  | Example A | Example B | Example C |
|---|---|---|---|
| Tetramethylsilane (4MS) Flow Rate (sccm) | 500 | 0 | 1500 |
| Silane (SiH$_4$) Flow Rate (sccm) | 0 | 550 | 0 |
| Nitrogen (N$_2$) Flow Rate (sccm) | 0 | 1600 | 1000 |
| Ammonia (NH$_3$) Flow Rate (sccm) | 0 | 4000 | 1200 |
| Total RF Power density (W/showerhead) | 170 | 140 | 300 |
| Pressure (Torr) | 2.3 | 2.2 | 4.0 |
| Treatment Duration (seconds) | 2 | 2 | 1 |

Referring briefly to FIG. 3, drawing 300 illustrates the organosilane plasma treatment or silicon nitride treatment in step 108 of FIG. 1 being performed. The cleaned copper (Cu) surface after step 106 receives the organosilane plasma treatment (indicated by arrows in drawing 302) or a thin silicon nitride layer deposition (indicated by arrows in drawing 304). Thus, step 108 provides a thin organosilane dielectric layer (e.g., SiC$_x$H$_y$) or a thin silicon nitride layer (e.g., Si$_3$N$_4$), as shown respectively in drawings 302 and 304, which prevents oxidation or contamination of the copper surface.

Returning to FIG. 1, in step 110 a copper diffusion barrier layer is deposited on the passivated copper surface. Ideally step 110 is an optional step for blocking copper diffusion because the copper surface is passivated to such an extent due to step 106 and step 108 that copper diffusion into a subsequent dielectric layer is retarded significantly and a copper diffusion barrier layer is not required. However, the copper diffusion barrier layer usually can be used to stop the etching process during via etching and is commonly known as an etch stop layer. Therefore, step 110 can be employed for the etching stop purpose and can be optimized independently from the copper diffusion barrier.

Copper diffusion into an undoped silicon dioxide dielectric layer is significantly reduced due to the prior application of the two sequential treatments (i.e., application of step 106 and 108 of FIG. 1). Thus, dielectric materials that have lower dielectric constants and/or higher etch selectivity may be selected for the dielectric layer and, for example, integrated into a copper damascene interconnect.

If a copper diffusion barrier layer is applied, only a very thin copper diffusion barrier layer such as 200 Å or less of silicon nitride (Si$_3$N$_4$) or silicon carbide (SiC), for example, is required rather than the typical 500 Å to 1000 Å thickness. Due to the passivated copper surface, the thin copper diffusion barrier layer may also completely block copper diffusion whereas the typical thicker copper diffusion barrier layer deposited on a copper surface not treated as in step 106 and step 108 may still allow copper diffusion to occur into the adjacent dielectric layer.

Furthermore, a copper diffusion barrier layer comprising any composition, including oxygen, can be deposited onto the passivated copper surface. Additionally, as discussed in further detail herein, due to the passivated copper surface (resulting from step 106 and step 1108), film adhesion of a copper diffusion barrier layer, including one containing oxygen, to the copper surface may improve by approximately 2.5 times while the bulk film properties of the copper diffusion barrier layer remain intact.

In accordance with a second embodiment of the present invention, the copper diffusion barrier layer deposited on the passivated copper surface, for the process in step 110, may include an organosilane as a precursor and carbon dioxide (CO$_2$) and/or carbon monoxide (CO) as a process gas. The copper diffusion barrier layer formed using this process provides excellent copper diffusion barrier properties and film characteristics. Furthermore, integration of the second embodiment with the first embodiment described-above, enables the smooth integration of the copper diffusion barrier layer with a damascene approach to form interconnects.

Figure 4:
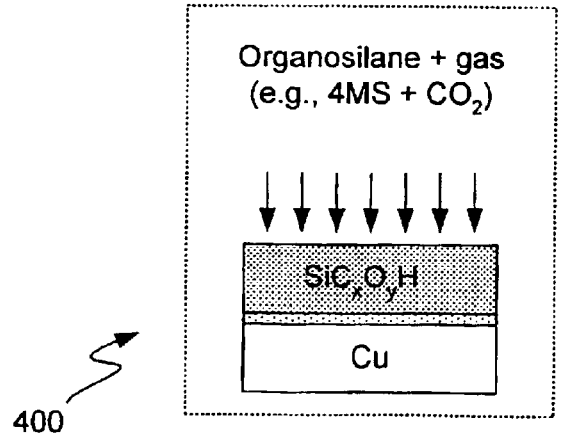
FIG. 4 is a drawing illustrating a copper diffusion barrier layer deposition in accordance with an embodiment of the present invention.

Referring briefly to FIG. 4, drawing 400 illustrates an exemplary copper diffusion barrier layer deposition in accordance with the second embodiment of the present invention. As shown, the process of step 110 is performed (i.e., dielectric barrier deposition) to deposit a copper diffusion barrier layer using an organosilane plasma plus a gas. In this example, the organosilane is tetramethylsilane (4MS) and the process gas is carbon dioxide (CO$_2$). The result of this process is the formation of a copper diffusion barrier layer (e.g., SiC$_x$O$_y$H) over the passivated copper surface.

An example of the use of an organosilane plus a process gas, such as carbon monoxide and/or carbon dioxide, can be found in U.S. patent application Ser. No. 09/888,279 entitled "Low Dielectric Constant Insulators And Supporting Layers Patterned By Deep Ultraviolet Photolithography," filed Jun. 21, 2001, which is incorporated herein by reference in its entirety.

Returning to FIG. 1, in step 112 a dielectric layer is deposited either on the passivated copper surface, after step 108, or on the copper diffusion barrier layer optionally deposited in step 110. The copper diffusion barrier layer, if provided, may include a conventional silicon carbide (SiC) material, for example, or a material as provided above in accordance with the second embodiment of the present invention.

As described in detail above and in accordance with some embodiments of the present invention, two sequential pre-treatments (i.e., in the same or sequential CVD chamber) are performed to passivate the copper surface prior to deposition of a copper diffusion barrier layer or a dielectric layer. The first pre-treatment includes plasma cleaning of the copper surface followed by the second pre-treatment of forming an ultra-thin passivation and glue layer.

These two pre-treatments improve the film adhesion on the copper surface of a subsequent layer (e.g., copper diffusion barrier layer or dielectric layer) while maintaining the bulk film properties of the subsequent layer. The two pre-treatments also inhibit copper diffusion into the subsequent layer.

For example, these two pre-treatments may occur in a PECVD chamber and prior to the deposition of a copper diffusion barrier layer. Because the copper surface is passivated, the copper diffusion barrier layer may Include materials containing oxygen and may be integrated with the copper damascene interconnect process.

Figure 5:
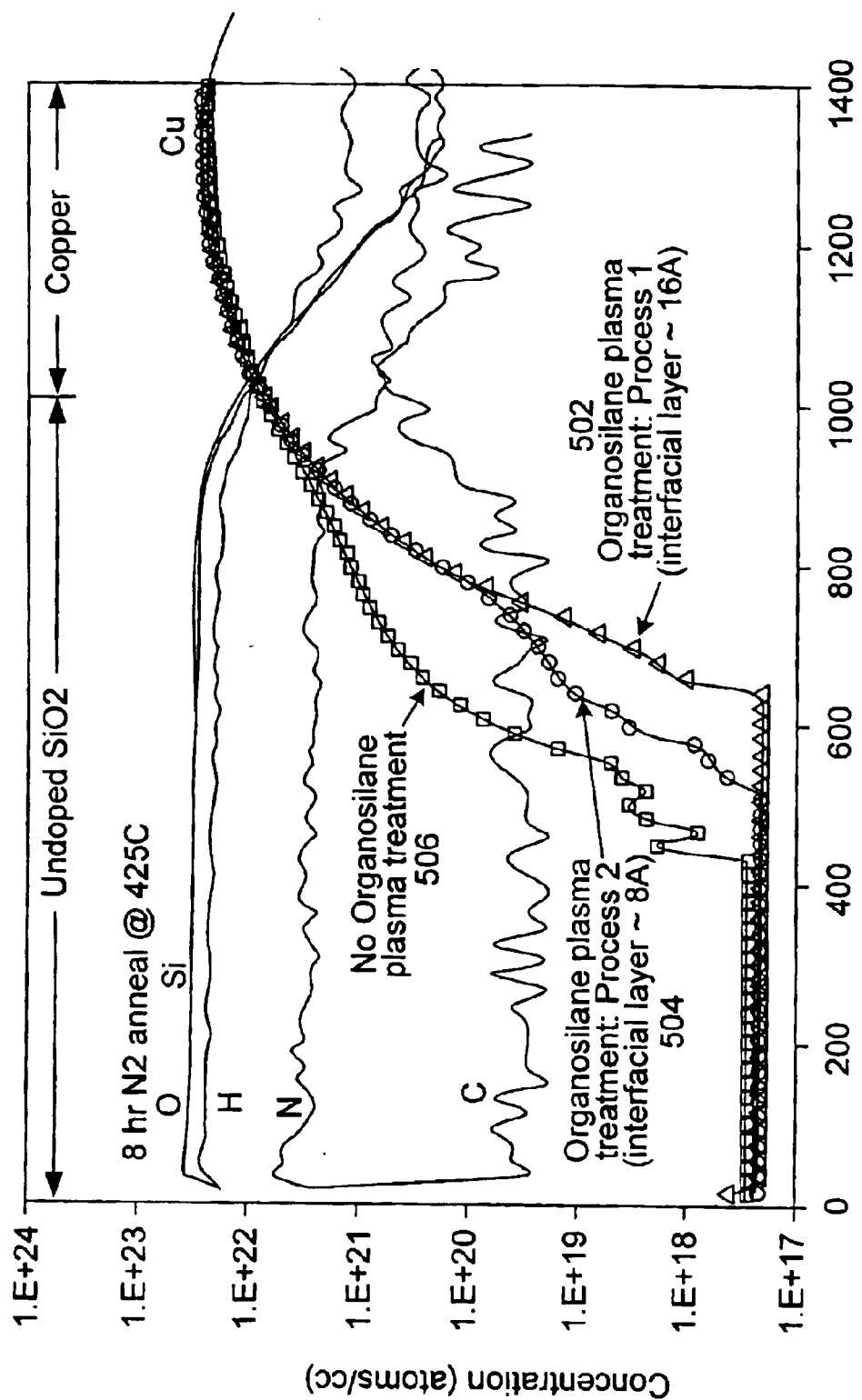
FIG. 5 is a graph illustrating copper diffusion for different test scenarios in accordance with one or more embodiments of the present invention.

FIG. 5 is a graph 500 illustrating copper diffusion for different test scenarios in accordance with one embodiment of the present invention. Graph 500 shows a plot of concentration (atoms/cc) versus film depth (Å) for copper diffusion of a copper metal layer into an undoped silicon dioxide (SiO$_2$) layer deposited on the copper metal layer.

The depth profiles were measured using a secondary ion mass spectroscopy (SIMS) technique.

A data line 502 (referred to as organosilane plasma treatment process 1 in FIG. 5) illustrates the amount of copper diffusion into the silicon dioxide layer when the copper surface is pre-treated with both the ammonia plasma pre-treatment (step 106 of FIG. 1) and organosilane plasma (4MS) pre-treatment (step 108 of FIG. 1). The pre-treatments produce an interfacial layer of approximately 16 Å.

A data line 504 (referred to as organosilane plasma treatment process 2 in FIG. 5) illustrates the amount of copper diffusion into the silicon dioxide layer when the copper surface is pre-treated with both the ammonia plasma pre-treatment (step 106 of FIG. 1) and organosilane plasma (4MS) pre-treatment (step 108 of FIG. 1). The pre-treatments produce an interfacial layer of approximately 8 Å. A data line 506 illustrates the amount of copper diffusion into the silicon dioxide layer when the copper surface is only treated with the ammonia plasma pre-treatment, but not an organosilane plasma pre-treatment.

Data line 506 shows that copper ions diffused substantially into the undoped silicon dioxide layer when only the ammonia plasma pre-treatment was performed. Data line 504 does show an improvement with the organosilane plasma pre-treatment (process 2 in FIG. 5, 8 Å layer) compared to data line 506, which does have the ammonia plasma pre-treatment but not the organosilane plasma pre-treatment. However, for data line 502 having both the ammonia plasma and the organosilane plasma pre-treatment treatment (process 1 in FIG. 5, 16 Å layer), copper diffusion into the undoped silicon dioxide layer was retarded considerably relative to data line 504 and data line 506.

Figure 6:
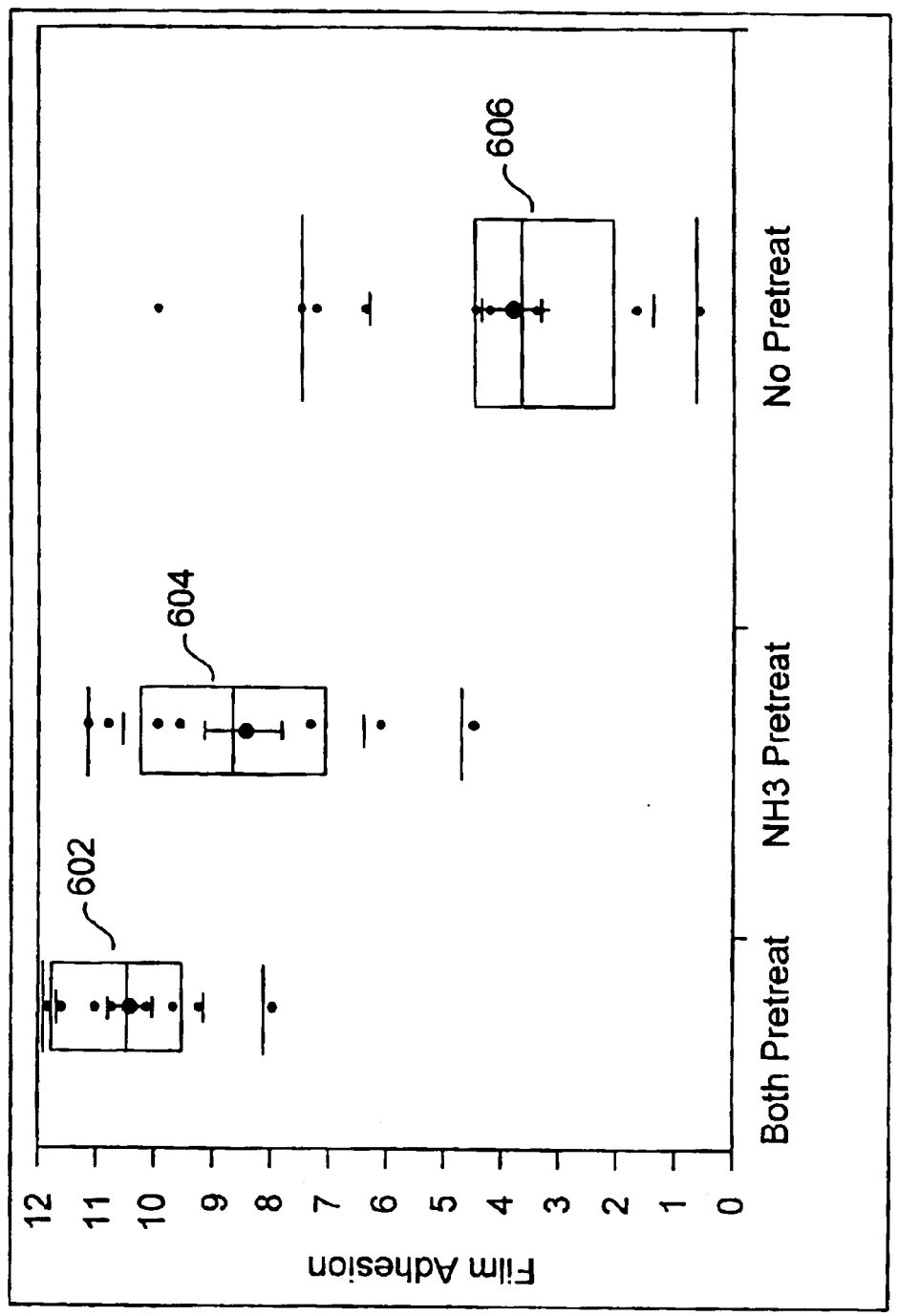
FIG. 6 is a graph illustrating film adhesion for different test scenarios in accordance with one or more embodiments of the present invention.

FIG. 6 is a graph 600 illustrating film adhesion for different test scenarios in accordance with one or more embodiments of the present invention. Graph 600 shows a plot of film adhesion (kpsi) for three different test scenarios of a silicon carbide layer deposited on a copper surface. The film adhesion strength was measured using a stud pull technique.

A test scenario 606 shows the film adhesion strength measurements for silicon carbide deposited on the copper surface that did not receive an ammonia plasma pre-treatment or an organosilane plasma pre-treatment (i.e., no pretreat). A test scenario 604 shows the film adhesion strength measurements for silicon carbide deposited on the copper surface that received only an ammonia plasma pre-treatment (i.e., $NH_3$ pretreat). A test scenario 602 shows the film adhesion strength measurements for silicon carbide deposited on a copper surface that received an ammonia plasma pre-treatment and then an organosilane plasma (4MS) pre-treatment (i.e., both pretreat).

Graph 600 illustrates that the silicon carbide film adhesion strength on a copper surface can be improved from approximately 4 kpsi (test scenario 606) to approximately 10 kpsi (test scenario 602) when both pre-treatments (i.e., steps 106 and 108 of FIG. 1) are performed on the copper metal layer. The deviation was also reduced for test scenario 602 compared to test scenario 606. If only the ammonia plasma pre-treatment is performed on the copper metal layer (test scenario 604), the silicon carbide film adhesion strength was improved only from 4 kpsi to 8.5 kpsi.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method of treating a copper layer of a semiconductor device, the method comprising:

placing the copper layer in a chemical vapor deposition chamber;

forming a first plasma in the chemical vapor deposition chamber;

exposing the copper layer to the first plasma; and exposing the copper layer to a second plasma to form a passivation layer approximately 30 angstroms to 200 angstroms thick on the copper layer, the second plasma comprising a silane.

2. The method of claim 1, wherein the second plasma is formed in a second chemical vapor deposition chamber.

3. The method of claim 2, wherein a vacuum is maintained during transport of the copper layer from the first chemical vapor deposition chamber to the second chemical vapor deposition chamber.

4. The method of claim 1, wherein the chemical vapor deposition chamber is at least one of a plasma enhanced chemical vapor deposition chamber or a high density plasma chemical vapor deposition chamber.

5. The method of claim 1, wherein the step of forming the first plasma comprises introducing into the chemical vapor deposition chamber at least one of an ammonia gas, a hydrogen gas, or a hydrocarbon gas.

6. The method of claim 5, wherein a flow rate of at least one of the ammonia gas, the hydrogen gas or the hydrocarbon gas is between approximately 2000 and 6000 sccm.

7. The method of claim 6, wherein the chemical vapor deposition chamber, for the first plasma, has a radio frequency power density per shower head between approximately 100 and 500 watts at a pressure between approximately 1 and 5 Torr for a duration between approximately 3 and 120 seconds.

8. The method of claim 1, wherein the exposing step comprises introducing into the chemical vapor deposition chamber a silane gas, a nitrogen gas, and an ammonia gas.

9. The method of claim 1, further comprising depositing a copper diffusion barrier layer and an etch stop layer onto the copper layer after the copper layer is passivated.

10. The method of claim 9, wherein the copper diffusion barrier layer and the etch stop layer are at least 50 Å thick.

11. The method of claim 9, wherein the copper diffusion barrier layer and the etch stop layer comprise at least one of a silicon nitride and a silicon carbide.

12. The method of claim 9, wherein the copper diffusion barrier layer is deposited by introducing into the chemical vapor deposition chamber an organosilane gas.

13. The method of claim 12, wherein the copper diffusion barrier layer is deposited by further introducing into the chemical vapor deposition chamber at least one of a carbon dioxide gas and a carbon monoxide gas.

14. The method of claim 9, wherein the copper diffusion barrier layer is deposited by introducing into the chemical vapor deposition chamber a silane gas with a nitrogen gas and an ammonia gas.

15. The method of claim 1, further comprising depositing a dielectric layer onto the semiconductor device after exposing the copper layer to the second plasma.

16. A method of semiconductor processing, the method comprising:

introducing at least one of an ammonia gas, a hydrogen gas, or a hydrocarbon gas into a first chemical vapor deposition chamber to clean a copper layer of a semiconductor device; and introducing a silane gas into the first chemical vapor deposition chamber or a second chemical vapor deposition chamber, after the copper layer is cleaned to form a passivation layer approximately 30 Å to 200 Å thick upon the copper layer, wherein the copper layer is transported from the first chemical vapor deposition chamber to the second chemical vapor deposition chamber while maintaining a vacuum surrounding the copper layer if the second chemical vapor deposition chamber is utilized.

17. The method of claim 6, further comprising introducing an organosilane gas into the first or second chemical vapor deposition chamber to deposit a copper diffusion barrier layer.

18. The method of claim 17, further comprising introducing at least one of a carbon dioxide gas and a carbon monoxide gas into the first or second chemical vapor deposition chamber to deposit a copper diffusion barrier layer.

19. The method of claim 16, further comprising depositing a dielectric layer onto the semiconductor device after the passivation layer is formed.

20. The method of claim 16, wherein the first and second chemical vapor deposition chambers are plasma enhanced chemical vapor deposition chambers.

21. A method of treating a copper layer of a semiconductor device, the method comprising:
   placing the copper layer in a chemical vapor deposition chamber;
   forming a first plasma in the chemical vapor deposition chamber;
   exposing the copper layer to the first plasma; and
   exposing the copper layer to a second plasma to form a passivation layer approximately 10 angstroms to 200 angstroms thick on the copper layer, the second plasma comprising an organosilane.

22. The method of claim 21, wherein the exposing step comprises introducing into the chemical vapor deposition chamber at least one of a trimethylsilane gas, a tetramethylsilane gas, a trimethylsilyl acetylene gas, a trimethylvinylsilane gas, a trimethylsilyl propyne gas, and a phenyl trimethylsilane gas.

23. The method of claim 22, wherein the exposing step further comprises introducing into the chemical vapor deposition chamber a nitrogen gas and an ammonia gas.

24. The method of claim 21, wherein the exposing step is performed at a flow rate between approximately 200 and 1500 sccm with a radio frequency power density per shower head between approximately 100 and 300 watts and a pressure between approximately 1 and 5 Torr for a duration between approximately 1 and 5 seconds.

25. A method of semiconductor processing, the method comprising:
   introducing at least one of an ammonia gas, a hydrogen gas, or a hydrocarbon gas into a first chemical vapor deposition chamber to clean a copper layer of a semiconductor device; and
   introducing an organosilane gas into the first chemical vapor deposition chamber or a second chemical vapor deposition chamber after the copper layer is cleaned to form a passivation layer approximately 10 Å to 200 Å thick upon the copper layer, wherein the copper layer is transported from the first chemical vapor deposition chamber to the second chemical vapor deposition chamber while maintaining a vacuum surrounding the copper layer if the second chemical vapor deposition chamber is utilized.

\* \* \* \* \*